(12) United States Patent
Ratni et al.

(10) Patent No.: US 6,683,471 B2
(45) Date of Patent: Jan. 27, 2004

(54) POWER DETECTOR USING FET TRANSISTOR

(75) Inventors: Mohamed Ratni, Esslingen (DE); Dragan Krupezevic, Stuttgart (DE); Veselin Brankovic, Esslingen (DE); Masayoshi Abe, Tokyo (JP); Noboru Sasho, Kanagawa (JP)

(73) Assignees: Sony International (Europe) GmbH, Berlin (DE); Sony Corporation, Tokyo (JP)

( * ) Notice: Subject to any disclaimer, the term of this patent is extended or adjusted under 35 U.S.C. 154(b) by 111 days.

(21) Appl. No.: 09/938,146

(22) Filed: Aug. 22, 2001

(65) Prior Publication Data
US 2002/0024357 A1 Feb. 28, 2002

(30) Foreign Application Priority Data
Aug. 24, 2000 (EP) .......................... 00118419.1

(51) Int. Cl.[7] .............................. G01R 31/26
(52) U.S. Cl. .................. 324/769; 324/95; 327/581
(58) Field of Search .............. 324/95, 118, 765–769, 324/158.1; 327/58, 62, 313, 344, 581; 329/304, 309–310; 375/298, 316, 320, 328, 360

(56) References Cited

U.S. PATENT DOCUMENTS 3,648,170 A * 3/1972 Embree et al. ............. 324/769
4,431,965 A    2/1984 Aslan
4,647,848 A * 3/1987 Barrett ........................ 324/95
5,079,454 A    1/1992 Benton et al.
6,239,625 B1 * 5/2001 Abe ............................ 327/58

FOREIGN PATENT DOCUMENTS

EP          0 957 614 A1 * 11/1999

OTHER PUBLICATIONS

Ratni M et al: "RF Power Detector Using a Silicon MOSFET" IEEE MTT–S International Microwave Symposium Digest, US, New York, NY: IEEE, Jun. 7, 1998, pp. 1139–1142, XP000822162.

* cited by examiner

Primary Examiner—Evan Pert
Assistant Examiner—Minh N. Tang
(74) Attorney, Agent, or Firm—Frommer Lawrence & Haug LLP; William S. Frommer; Darren M. Simon

(57) ABSTRACT

The present invention relates to a circuitry for detecting the power of a RF signal (7) comprising a FET transistor (1) connected in parallel to two inputs (2, 2') for supplying the RF signal and two outputs (13, 13') for detecting the power of the RF signal (7). The circuitry has a resistor (9) having a resistance larger than the drain-source resistance of the FET transistor (1). This resistor (9) is connected between one of the outputs and the source (14) of the FET transistor (19. Further a capacitor (10) is connected between one of the input and the source of the FET transistor. The gate (8) of the FET transistor is connected to ground.

11 Claims, 11 Drawing Sheets

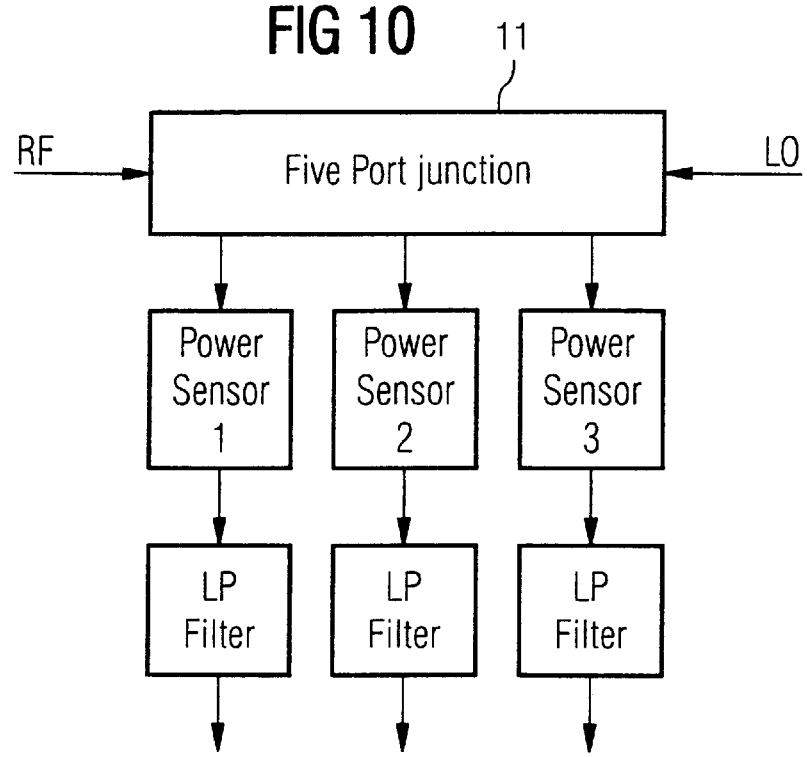
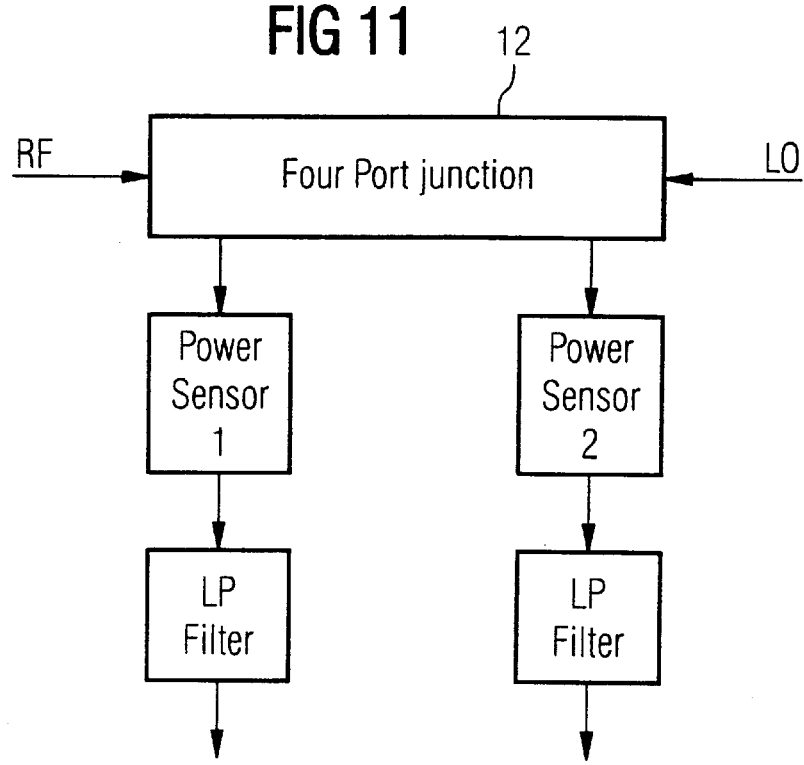

POWER DETECTOR USING FET TRANSISTOR

The present invention relates to the power detection of a RF signal. Particularly, the present invention relates to a circuitry for detecting the power of the RF signal comprising a FET transistor which is connected in parallel to two inputs for supplying the RF signal and two outputs for detecting the power of the RF signal.

It is well known to use a biased Schottky diode for power measurements in RF technologies. Due to its nonlinear current voltage characteristic the diode causes a deformation of the RF signal. Furthermore thermistors are used in RF power measurements, but they are suitable only for high RF power signals due to their low sensitivity.

Field effect transistors (FETs) present also a nonlinear current voltage I–V characteristic. Therefore they are also suitable as RF power detector. The FET transistor shows a better sensitivity than the biased Schottky diode and the output voltage is directly available. A power detector comprising a FET transistor is less sensitive to temperature variations than a power detector based on a Schottky diode. Also the effective noise voltage of the diode detector, 600 nV, is four times as high as the noise level of a detector comprising a FET transistor. All these advantages make the FET detector more and more important in the RF power measurements.

As mentioned above, the basic detector concept relies on a deformation of the RF signal with a nonlinear element. Therefore the RF signal will be decomposed in a DC signal component and a number of harmonics:

$$I = I_{dc} + \text{Fundamental} + \text{Harmonics}$$

The DC current is a function of the RF signal amplitude. The output voltage $V_{out}$ is proportional to the RF power signal at low power levels thanks to the nonlinear I–V characteristic.

In M. Ratni, B. Huyart, E. Bergeault, L. P. Jallet. "RF Power Detector using a silicon MOSFET" IEEE MTT-S Digest Baltimore Md. 1998, a structure for such a RF power detector is proposed.

The design of such a RF power detector structure according to the above state of the art is shown in FIG. 13. T2 is a Silicon MOS transistor biased through an RC cell at $V_{gs}=0.6V$. The transistor is parallel to the RF power line feed. A high pass filter capacitor C1 (60 pF) is responsible for the isolation from the generator $V_{RF}$. Between the transistor and the output circuit $R_{Load}$ (10kΩ) and C3 (10 pF) should be placed theoretically a low pass filter but, due to technology constraints, this filter has been replaced by a resistance R1 (1kΩ) whose value is greater than the drain-source resistor. The RF signal will then flow through the transistor. Its DC current is collected at the load resistance $R_{Load}$, capacitor C3 is used as a shunt element for the remaining harmonics of the RF signal.

As it can be seen, the structure of this power detector is asymmetrical. Therefore it cannot be operated in a differential mode, which is a drawback of this structure.

The object of the present invention is therefore to propose a technique for detecting the power of a RF signal with a circuitry using a FET transistor and a method for detecting the power of a RF signal, which technique is compatible with a differential operating mode.

The above object is achieved by means of a circuitry for detecting the power of a RF signal comprising a FET transistor connected in parallel to two inputs for supplying a RF signal and two outputs for detecting the power of the RF signal, wherein a resistor having a resistance larger than the drain-source resistance of the FET transistor is connected between one of the output and the source of the FET transistor.

A capacitor is connected between one of the input and the source of the FET transistor.

The gate of the FET transistor is connected to ground.

Further the gate of the FET transistor is self biased respectively externally biased.

The above object is further achieved by means of a method for detecting the power of a RF signal by a circuitry comprising a FET transistor connected in parallel to two inputs for supplying a RF signal and two outputs for detecting the power of the RF signal, wherein the circuitry is supplied differentially with a RF signal to a RF input, respectively supplied with a RF signal at a single RF input.

According to further aspects of the invention an I/Q demodulator device, a (m)_PSK (phase shift keying) demodulator and a (m)_QAM (quadrature amplitude modulation) demodulator are proposed (wherein m is an integer).

According to the invention furthermore a five-port I/Q demodulator is provided using three circuitries as set forth above wherein one of the circuitry is supplied differentially with the RF signal to a RF input and two of the circuitries are supplied with a RF signal at a single RF input.

At last one n-Port I/Q demodulator using a number of n–2 as set forth above is provided wherein all of the circuitries are supplied with a RF signal at a single RF input.

In the following description further features, characteristics and advantages of the present invention will come clearer by means of a detailed explanation of embodiments of the present invention and by reference to the figures of the enclosed drawings.

FIG. 1 shows a self-biased passive power detector structure according to an embodiment of the present invention, FIG. 2 shows the self biased passive power detector (SBPPD) characteristic, FIG. 3 shows the S-Parameters simulation reflection coefficient, (Each S-Parameter is the ratio between an output and an input wave at a transistor to be seen as a four-port, S11 is the input reflection coefficient)

FIG. 4 shows the S-Parameters simulation S11 with input matching,

FIG. 5 shows the self-biased passive power detector (PPD) characteristic with 50 Ohm input matching, FIG. 6 shows a biased passive power detector structure, FIG. 7 shows the biased passive power detector (BPPD) characteristic, FIG. 8 shows the reflection coefficient S11 of the passive power detector (PPD), FIG. 9 shows the PPD characteristic and S11 variation, FIG. 10 shows schematically a five-port junction demodulator using a self-biased power detector, FIG. 11 shows schematically a four-port junction demodulator using a self-biased power detector, FIG. 12a shows a differential input—differential output self-biased power detector, FIG. 12b shows a single input—single output self-biased power detector, FIG. 12c shows a differential input—single output self-biased power detector, FIG. 12d shows a single input—differential output self-biased power detector, and FIG. 13 shows schematically a RF power detector structure according to the state of the art.

FIG. 1 shows a self-biased passive power detector structure according to an embodiment of the invention. The transistor (1) is connected in parallel to the RF power line feed (2). The transistor (1) is isolated from the RF input terminals (2, 2') by a high pass filter capacitor C1 (3). Theoretically a low pass filter should be placed between the transistor (1) and the output circuit $R_{Load}$ (4) and C3 (5) but, due to technology constraints, this filter has been replaced by a resistor R1 (6) whose resistance is greater than the resistance of the drain-source resistor. The RF signal (7) flows through the transistor (1). It's DC current is collected at outputs (13, 13') detecting the voltage drop over a load resistance $R_{Load}$ (4). The capacitor C3 (5) is used as a shunt element for the remaining harmonics of the RF signal (7).

This circuit structure uses no external gate bias voltage as the gate (8) is directly connected to ground. However, the gate (8) is biased by a portion of the rectified RF-DC-signal flowing through the resistor R2. The potential of the source (14) of the transistor (1) and thus the gate-source-voltage is proportional to the DC current through the resistor R2 (9). Therefore the gate-source-voltage is proportional to the RF-power. With other words, the transistor is biased with a voltage proportional to the power of the RF signal.

The resistor R2 (9) is used as a second low pass filter for the remaining harmonics. The capacitor C2 (10) has the function of a high pass filter for the DC current. By the implementation of R2 (9) and C2 (10) the circuitry has a symmetrically design whereby the operation of the power detector in a differential mode is possible.

Due to this circuit design the transistor (1) is continually biased with a portion of the deformed RF signal proportional to the RF power. The resistor R2 (9) and the capacitor C2 (10) are also used to avoid that a part of the deformed RF signal (DC and some harmonics) causes a perturbation while the detector is operating as a differential input power detector.

This detector circuit design permits to detect directly the detected output voltage without any DC offset as the gate (8) of the transistor is not externally biased. Furthermore the transistor (1) does not show shot noise because no DC bias current flows through the barrier layer. In consequence, the detector allows a large dynamic range and the lower dynamic bound is given only by the thermal noise.

Note that this power detector circuit is a passive circuit, because it provides no active elements. Also the FET transistor is used as a passive element without supply voltage.

FIGS. 2 to 5 and FIGS. 7 to 9 show simulation results obtained by using RF simulation software. For the FET transistor Sony's 0.5 µm GaAs JFET technology has been utilized.

FIG. 2 shows a comparison in simulation between two detectors using different sizes of the transistor (50 and 100 µm). Both curves are approximately similar to each other. It can be stated that the detection level is very good and that the sensitivity for a low power input is acceptable.

In FIG. 3 the S-parameter simulations are presented. It can be seen that the reflection coefficient S11 is very high, around −1 dB. This value of S11 was obtained without any matching at the input.

By adding the matching the circuitry input reflection coefficients tend to take good values as it can be seen in FIG. 4. The reflection coefficient S11 with input matching is lower than −25 dB.

However, as it can be seen in FIG. 5, the drawback of the 50 Ohm input matching for the SBPPD is that the sensitivity decreases by a factor 2 and also the linearity, which is may be an important characteristic for specific applications.

In order to improve the linearity of the detector, the gate of the FET transistor can be biased with a low DC voltage 15 as shown in the embodiment of FIG. 6. Thereto the gate 8 of the FET transistor 1 is connected to a DC voltage source 15. The value of the bias voltage $V_{gs}$ is set close to the pinch off voltage of the transistor to tear maximum benefit of the non-linearity of the transistor to enhance the detection efficiency. Note that the gate biasing power consumption still tends to be very small and that still there is no DC biasing like in a drain biased FET detector.

FIG. 7 shows a simulation result of the BPPD which has been obtained with a transistor gate size equal to 100 µm and a biasing voltage of $V_{gs}$=0.3 V. It may be seen that the linearity is improved by biasing the gate of the transistor, but, on the other hand, that the sensitivity has decreased. In this case the use of an operational amplifier is recommended.

The new FET power detector is suitable for digital direct receiver using a five-port junction 11 as a broadband demodulator, as it is illustrated in FIG. 10.

FIG. 11 shows how the new FET power detector can be used for power measurements in a four-port junction 12 working as a (n)QAM or as a (n)PSK demodulator.

The new FET power detector can be operated in different modes.

Figure 1:
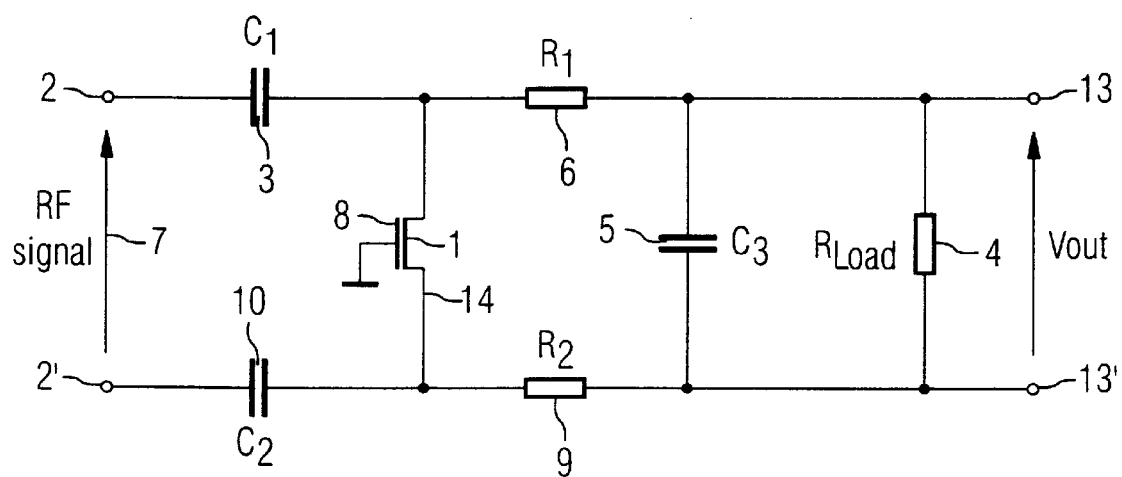
Figure 2:
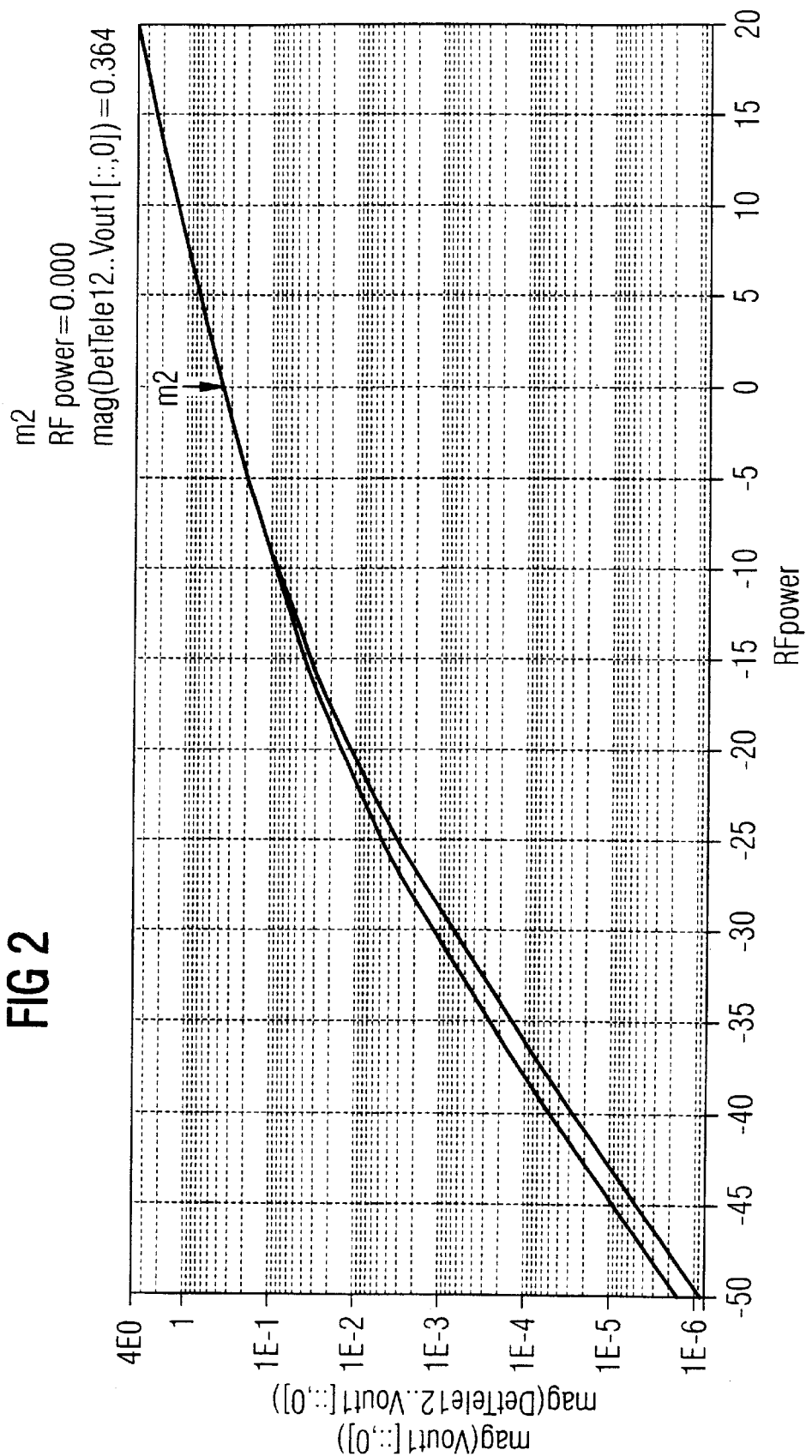
Figure 3:
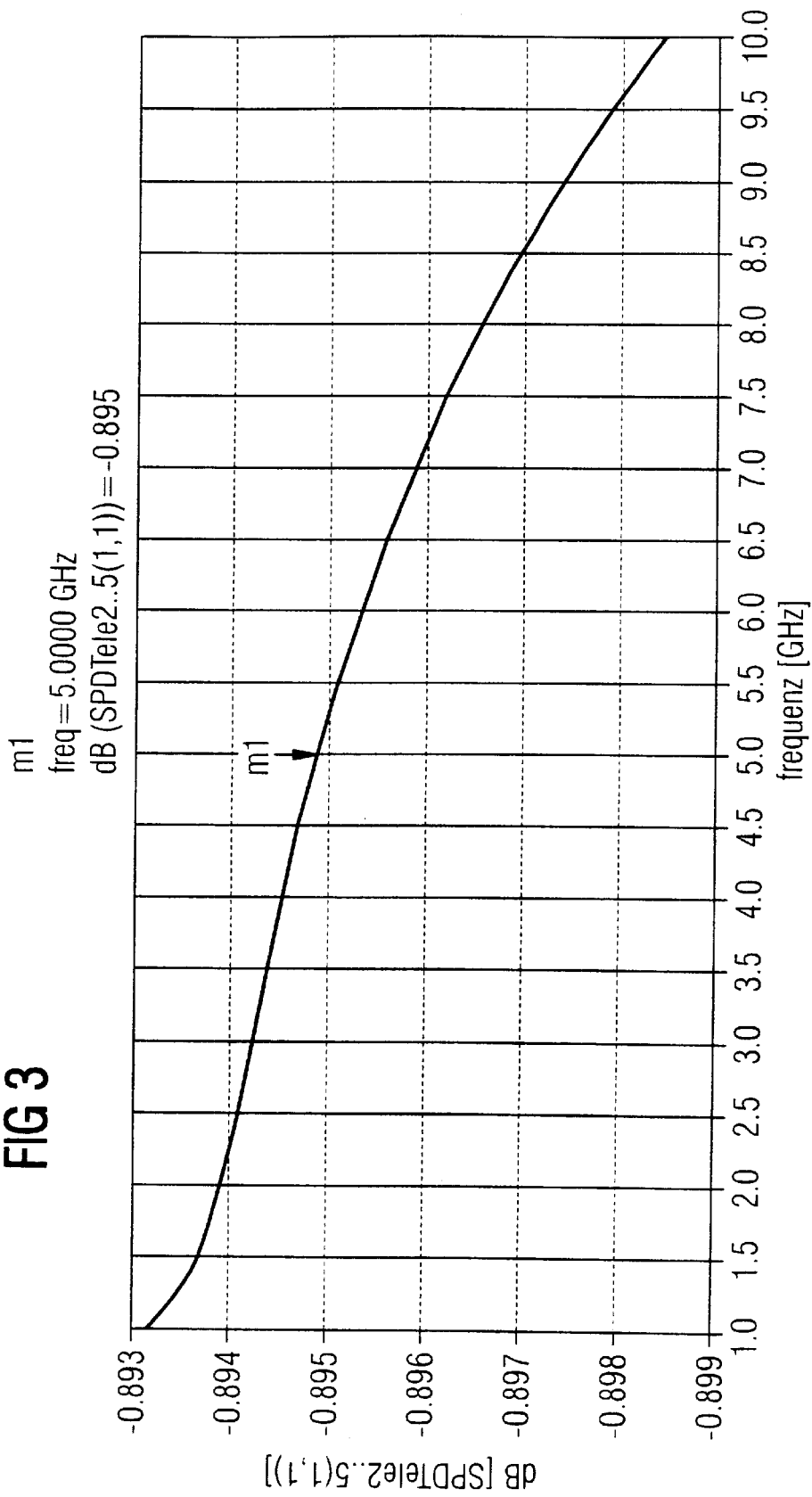
Figure 4:
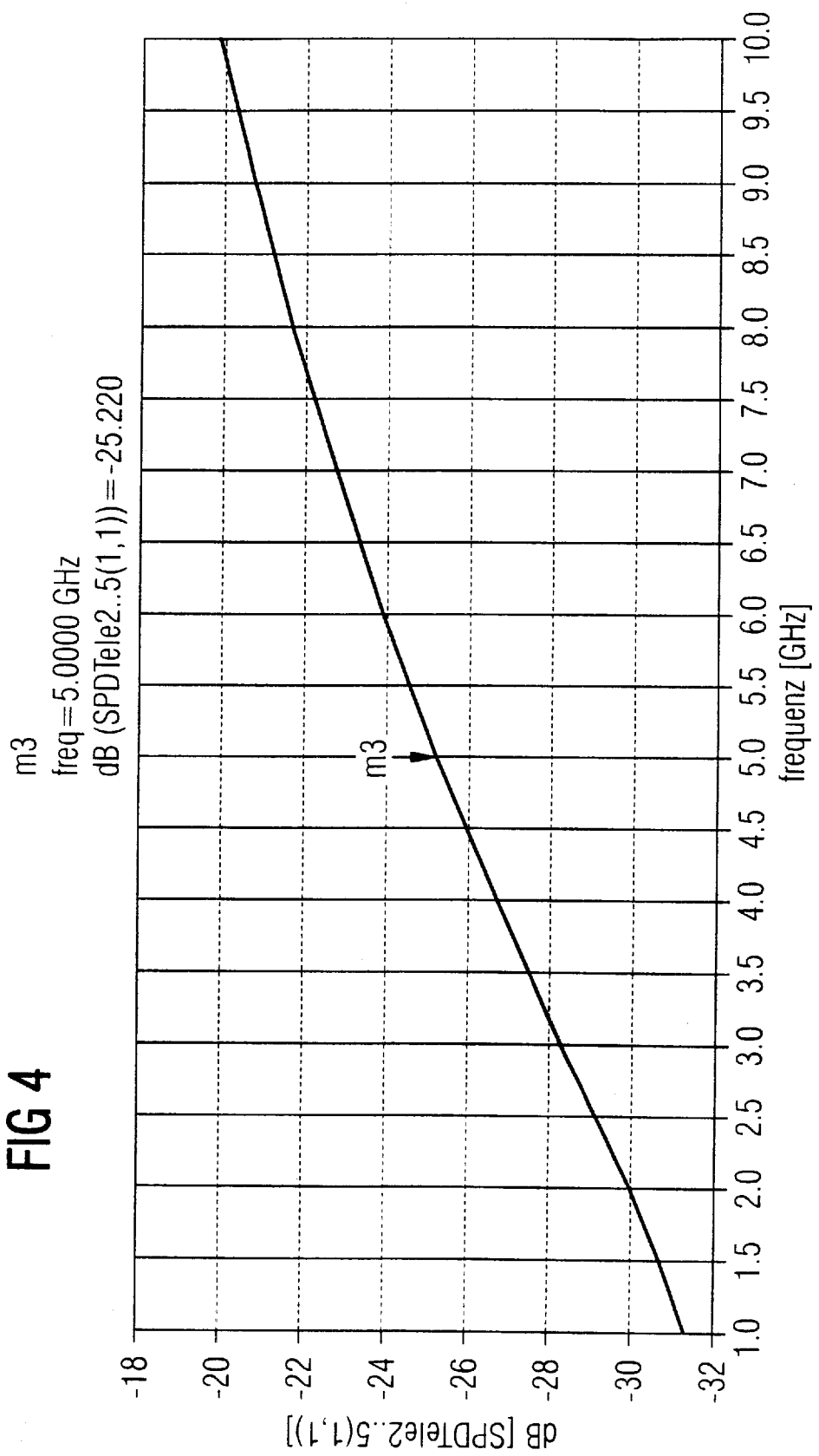
Figure 5:
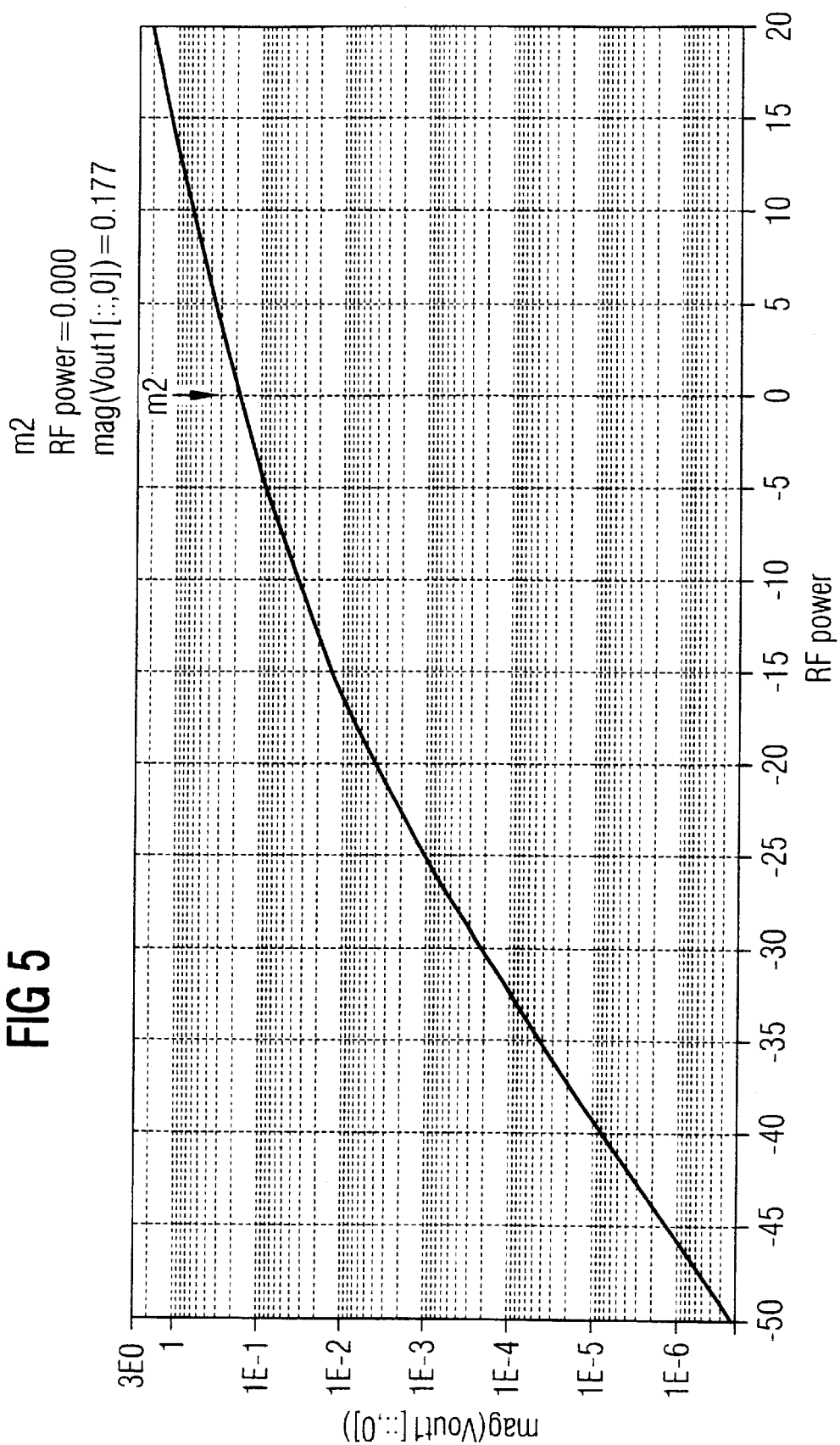
Figure 6:
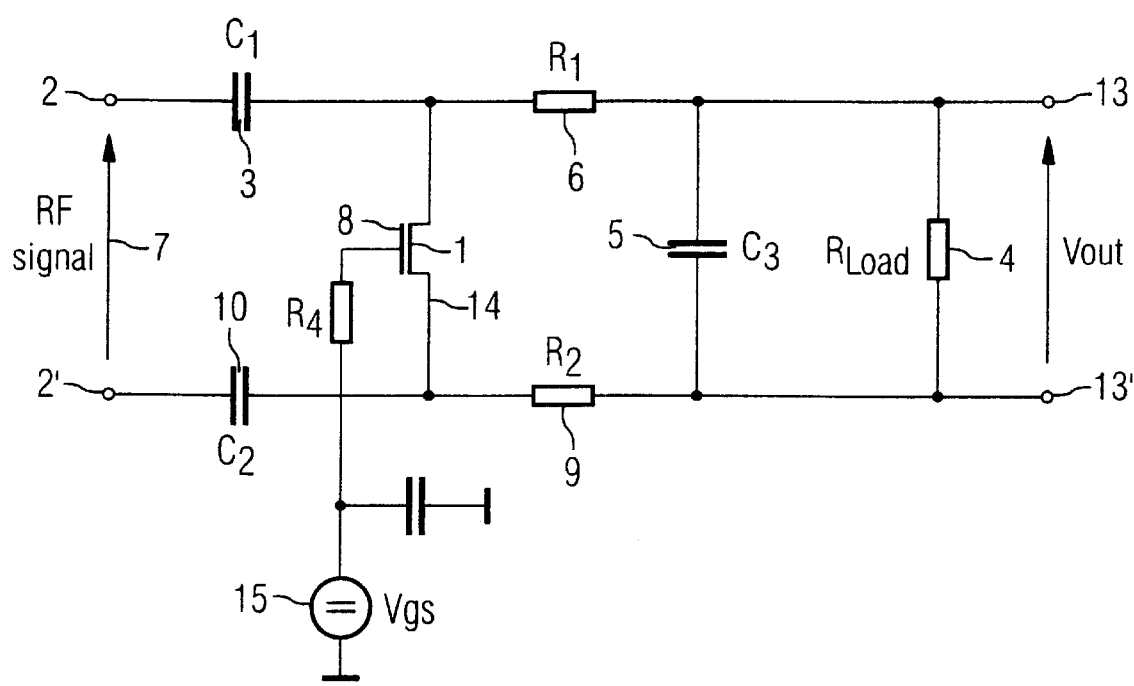
Figure 7:
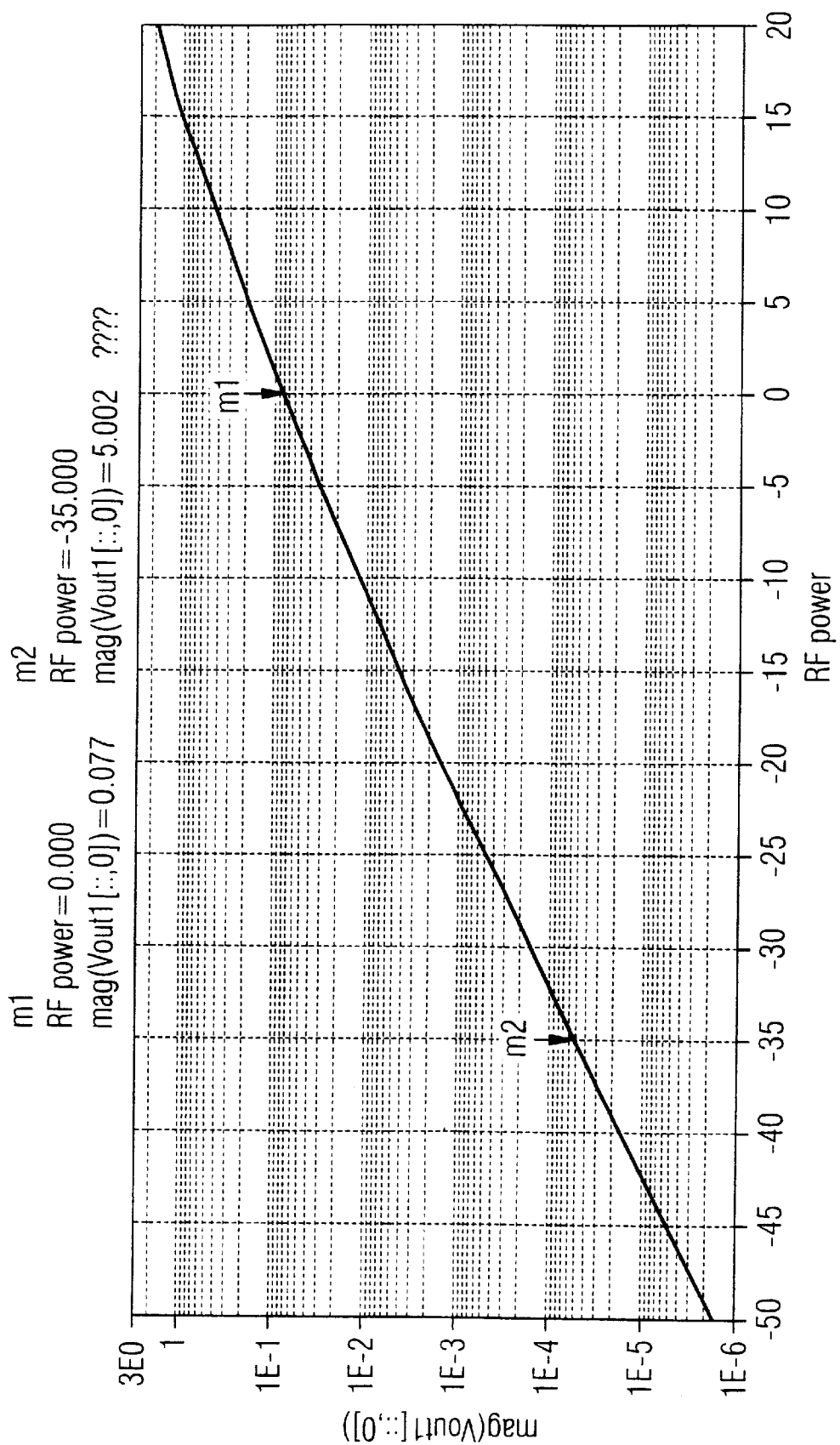
Figure 8:
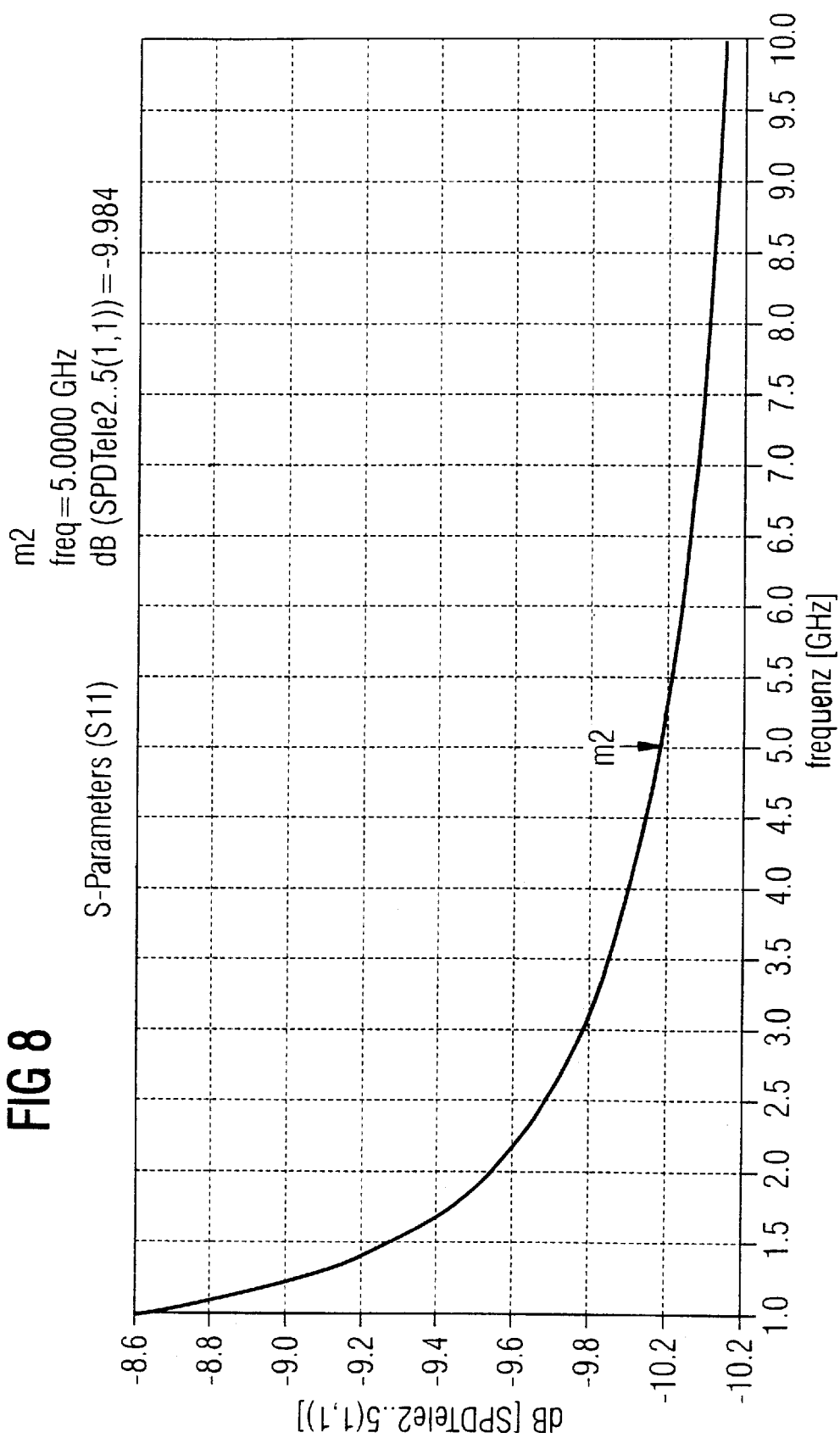
FIG. 8 shows the simulation result for the S-Parameter of the BPPD. It can be seen that the reflection coefficient S11 is around −10 dB at 5 GHz, with a gate bias voltage $V_{gs}$=0.3 V.
Figure 9:
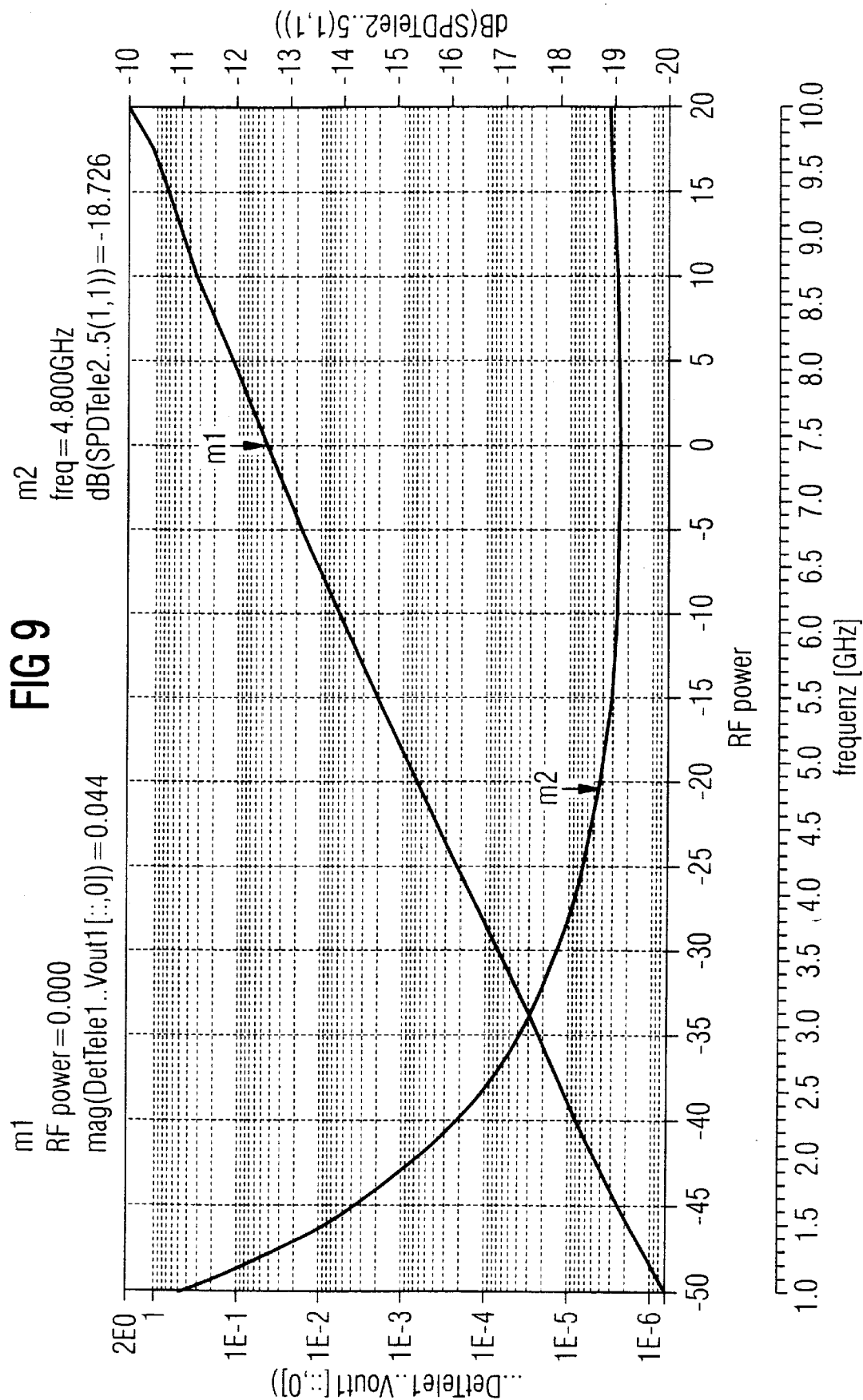
FIG. 9 shows the PPD characteristic and S11 variation.
Figure 12A:
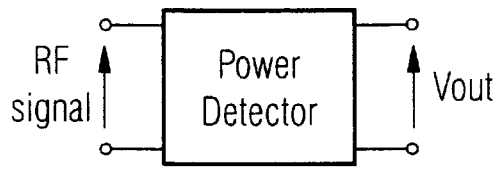

In FIG. 12a the circuitry is supplied differentially with a RF signal to the RF input and the power of the RF signal is differentially detected by the DC output.

Figure 12B:
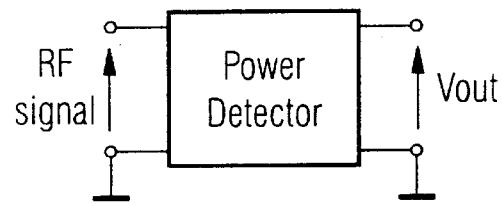

In FIG. 12b the circuitry is supplied with a RF signal at a single RF input (the other single input is connected to ground) and the power of the RF signal is detected on the basis of a single DC output, the other single DC output is connected to ground.

Figure 12C:
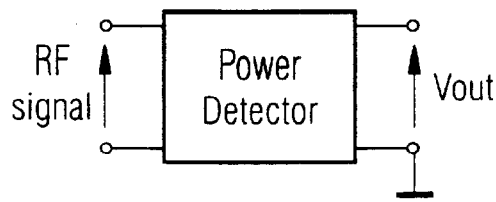

In FIG. 12c the circuitry is supplied differentially with a RF signal to the RF input and the power of the RF signal is detected on the basis of a single DC output, the other single DC output is connected to ground.

Figure 12D:
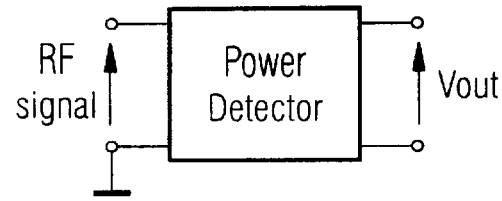
Figure 13:
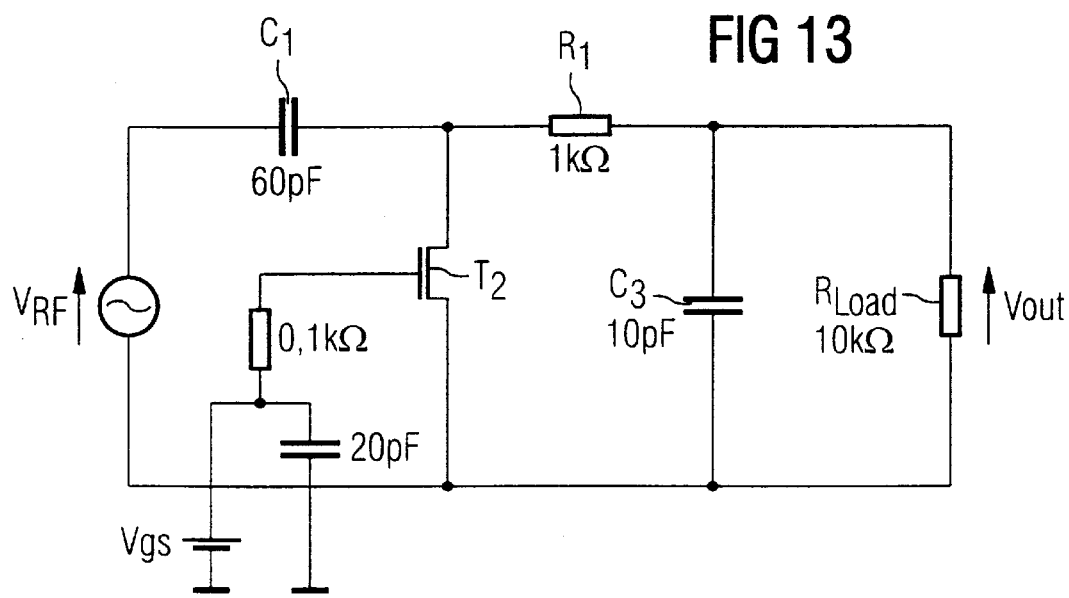

In FIG. 12d the circuitry is supplied with a RF signal at a single RF input, the other single input is connected to ground, and the power of the RF signal is differentially detected by the DC output.

What is claimed is:

1. Circuitry for detecting a power of a RF signal (7) comprising a FET transistor (1) connected in parallel to two inputs (2, 2') for supplying the RF signal and two outputs (13, 13') for detecting the power of the RF signal, characterized in that a resistor (9) having a resistance value larger than the drain-source resistance of the FET transistor (1) is connected between one (13') of the outputs and the source (14) of the FET transistor (1); and a capacitor (10) is connected between one of the inputs and the source (14) of the FET transistor (1).

2. Circuitry according to claim 1, characterized in that the gate (8) of the FET transistor (1) is connected to ground.

3. Circuitry according to claim 1, characterized in that the gate (8) of the FET transistor (1) is self biased with a voltage proportional to the power of the RF signal(7).

4. Circuitry according to claim 1, characterized in that the gate of the FET transistor (1) is externally biased with a DC voltage (15).

5. Method of detecting a power of a RF signal (7) by a circuitry comprising a FET transistor (1) connected in parallel to two inputs (2, 2') for supplying the RF signal and two outputs (13, 13') for detecting the power of the RF signal, characterized in that the circuitry has a resistor (9) having a resistance value larger than the drain-source resistance of the FET transistor (1) is connected between one (13') of the outputs and the source (14) of the FET transistor (1);

a capacitor (10) is connected between one of the inputs and the source (14) of the FET transistor (1); and wherein the circuitry is supplied differentially with the RF signal at the inputs (2, 2').

6. Method according to claim 5, characterized in that the power of the RF signal is differentially detected at the DC outputs (13, 13').

7. Method according to claim 5, characterized in that the power of the RF signal is detected on the basis of a single DC output.

8. Method according to claim 5, characterized in that the FET (1) transistor is biased proportional to the power of the RF signal.

9. Method of detecting a power of a RF signal (7) by a circuitry comprising a FET transistor (1) connected in parallel to an input (2) for supplying the RF signal and two outputs (13, 13') for detecting the power of the RF signal, characterized in that the circuitry has a resistor (9) having a resistance value larger than the drain-source resistance of the FET transistor (1) is connected between one (13') of the outputs and the source (14) of the FET transistor (1);

a capacitor (10) is connected between the input and the source (14) of the FET transistor (1); and wherein the circuitry is supplied differentially with the RF signal (7) at the input and the FET transistor (1) is biased proportionally to the power of the RF signal.

10. Method according to claim 9, characterized in that the power of the RF signal is differentially detected by a DC output.

11. Method according to claim 9, characterized in that the power of the RF signal (7) is detected on the basis of a single DC output.

* * * * *